(12) United States Patent
Funada et al.

(10) Patent No.: US 7,307,853 B2
(45) Date of Patent: Dec. 11, 2007

(54) WIRED CIRCUIT BOARD ASSEMBLY

(75) Inventors: Yasuhito Funada, Osaka (JP);
Yoshihiko Takeuchi, Osaka (JP);
Hitoki Kanagawa, Osaka (JP); Tetsuya Ohsawa, Osaka (JP)

(73) Assignee: Nitto Denko Corporation (JP)

( * ) Notice: Subject to any disclaimer, the term of this patent is extended or adjusted under 35 U.S.C. 154(b) by 0 days.

(21) Appl. No.: 11/342,215

(22) Filed: Jan. 30, 2006

(65) Prior Publication Data

US 2006/0169486 A1 Aug. 3, 2006

(30) Foreign Application Priority Data

Jan. 31, 2005 (JP) ............................. 2005-024009

(51) Int. Cl.
*H05K 7/02* (2006.01)
*H05K 7/06* (2006.01)
*H05K 7/08* (2006.01)
*H05K 7/10* (2006.01)

(52) U.S. Cl. ...................... 361/760; 361/749; 361/795; 174/254; 174/258

(58) Field of Classification Search ........ 174/254–258; 361/749–750, 795

See application file for complete search history.

(56) References Cited

U.S. PATENT DOCUMENTS

| | | | |
|---|---|---|---|
| 5,905,633 A | * | 5/1999 | Shim et al. ................. 361/704 |
| 6,106,688 A | | 8/2000 | Miyazaki et al. |
| 6,173,485 B1 | | 1/2001 | Shiraishi et al. |
| 6,202,288 B1 | | 3/2001 | Shiraishi et al. |
| 6,399,423 B2 | * | 6/2002 | Matsuura et al. ........... 438/123 |
| 6,664,647 B2 | * | 12/2003 | Kasuga et al. .............. 257/787 |

FOREIGN PATENT DOCUMENTS

| | | |
|---|---|---|
| JP | HEI 10-320736 | 12/1998 |
| JP | HEI 11-195214 | 7/1999 |

* cited by examiner

*Primary Examiner*—Tuan T. Dinh
(74) *Attorney, Agent, or Firm*—Akerman Senterfitt; Jean C. Edwards, Esq.

(57) ABSTRACT

There is provided a wired circuit board assembly that prevents breakage of the flexing portion of a wired circuit board supported by a support frame. In a wired circuit board support sheet, a plurality of wired circuit boards include a base insulating layer, a conductor pattern, and a cover insulating layer which are formed on a support board are supported by a support frame in such a manner that they are arranged and aligned in mutually spaced relation. Each of the wired circuit boards has a flexing portion formed by removing the support board to obtain a flexing property. In addition, second connecting portions are provided in spanning relation between the flexing portion and the vertical frame parts of the support frame.

8 Claims, 5 Drawing Sheets

(a)

(b)

(a)

(b)

(c)

(d)

(e)

(f)

(g)

WIRED CIRCUIT BOARD ASSEMBLY

CROSS REFERENCE TO RELATED APPLICATION

This application claims priority from Japanese Patent Appln. No. 2005-24009, filed Jan. 31, 2005, the contents of which are herein incorporated by reference in their entirety.

BACKGROUND OF THE INVENTION

1. Field of the Invention

The present invention relates to a wired circuit board assembly. More particularly, the present invention relates to a wired circuit board assembly in which a plurality of wired circuit boards are supported by a support frame in such a manner that they are arranged and aligned in mutually spaced apart relation.

2. Description of the Prior Art

A suspension board with circuit includes a base insulating layer, a conductor pattern, and a cover insulating layer which are formed successively on a support board composed of a metal sheet. In the process of manufacturing the suspension board with circuit, after the processing of the metal sheet, a plurality of suspension boards with circuits are supported by a support frame composed of the metal sheet in such a manner that they are arranged and aligned in mutually spaced apart relation.

To manufacture, e.g., a suspension element for magnetic head having a surface thereof provided with a pattern of a plurality of wiring conductors, a method has been proposed in which a belt-like metal sheet serving as a base for the suspension element is prepared in a wound-up roll, regions in a predetermined pattern are specified on a surface of the metal sheet as a work member, and a plurality of stepwise patterning processes are performed successively with respect to the work member such that a plurality of suspension elements and the wiring conductors thereof are formed as an integrally connected body. The work member is kept in the wound-up roll while it is passed between individual processing units for the patterning processes (see Japanese Unexamined Patent Publication No. Hei 10-320736).

In accordance with the method, peripheral patterns are removed so that the suspensions are formed in a state held by a board via some of connecting portions (see FIG. 8 of Japanese Unexamined Patent Publication No. Hei 10-320736).

There has also been proposed a method for manufacturing a suspension with a magnetic head mounted thereon. In accordance with the method, a plurality of flexure pieces each provided with a conductor pattern for connection are formed in mutually connected relation to maintain a substantially flat surface state and a slider having a magnetic head element is mounted on each of the flexure pieces or, alternatively, an IC chip for head is mounted on each of the flexure pieces before the slider having the magnetic head element is mounted thereon. The flexure pieces with the magnetic head elements mounted thereon are then individually separated from each other (see Japanese Unexamined Patent Publication No. Hei 11-195214).

The suspension board with circuit has a flexing portion formed by partially removing the support board to obtain a flexing property depending on the purpose and application thereof. After the processing of the metal sheet, however, such a flexing portion may be broken occasionally, while the suspension board with circuit is being supported by the support frame.

SUMMARY OF THE INVENTION

It is therefore an object of the present invention to provide a wired circuit board assembly which allows effective prevention of the breakage of the flexing portion of a wired circuit board supported by a support frame.

To attain the object, a wired circuit board assembly according to the present invention comprises: a plurality of wired circuit boards each having a support board composed of a metal sheet, a base insulating layer composed of a resin thin film formed on the support board, a conductor pattern formed on the base insulating layer, and a cover insulating layer composed of a resin thin film formed on the base insulating layer to cover the conductor pattern; and a support frame for supporting the plurality of wired circuit boards in such a manner that they are arranged and aligned in mutually spaced apart relation, wherein at least one of the wired circuit boards has a flexing portion from which the support board has been removed and the support frame has a connecting portion connected to the flexing portion.

In the wired circuit board assembly according to the present invention, at least one part of the connecting portion is preferably composed only of the resin thin film composing the base insulating layer and/or the cover insulating layer.

In the wired circuit board assembly according to the present invention, the wired circuit board is preferably a suspension board with circuit.

In the wired circuit board assembly according to the present invention, at least one of the wired circuit boards is formed with the flexing portion from which the support board has been removed. To the flexing portion, the connecting portions of the support frame have been connected. The arrangement allows effective prevention of the breakage of the flexing portion of the wired circuit board supported by the support frame.

BRIEF DESCRIPTION OF THE DRAWINGS

FIG. 4 is an enlarged view of a principal portion of the second connecting portion shown in FIGS. 2 and 3, of which:

FIG. 4(a) is an enlarged plan view of the principal portion thereof corresponding to FIG. 2; and FIG. 4(b) is an enlarged rear view of the principal portion thereof corresponding to FIG. 3;

FIG. 5 is a manufacturing process chart taken along the line A-A of FIG. 1 to illustrate a method for manufacturing the wired circuit board support sheet shown in FIG. 1, of which FIG. 5(a) shows the step of preparing a metal sheet;

FIG. 5(b) shows the step of forming, on the metal sheet, a pattern composed of a plurality of base insulating layers and second connecting portions extending continuously from each of the base insulating layers to define a pattern corresponding to a plurality of wired circuit boards;

FIG. 5(c) shows the step of forming a conductor pattern on each of the base insulating layers;

FIG. 5(d) shows the step of forming a cover insulating layer on each of the base insulating layers such that each of the conductor patterns is covered therewith;

FIG. 5(e) shows the step of covering the respective portions of the metal sheet corresponding to the support boards, an outer frame, a middle frame, and first connecting portions with an etching resist;

FIG. 5(f) shows the step of etching the metal sheet exposed from the etching resist; and FIG. 5(g) shows the step of removing the etching resist;

DESCRIPTION OF THE PRESENT INVENTION

Figure 1:
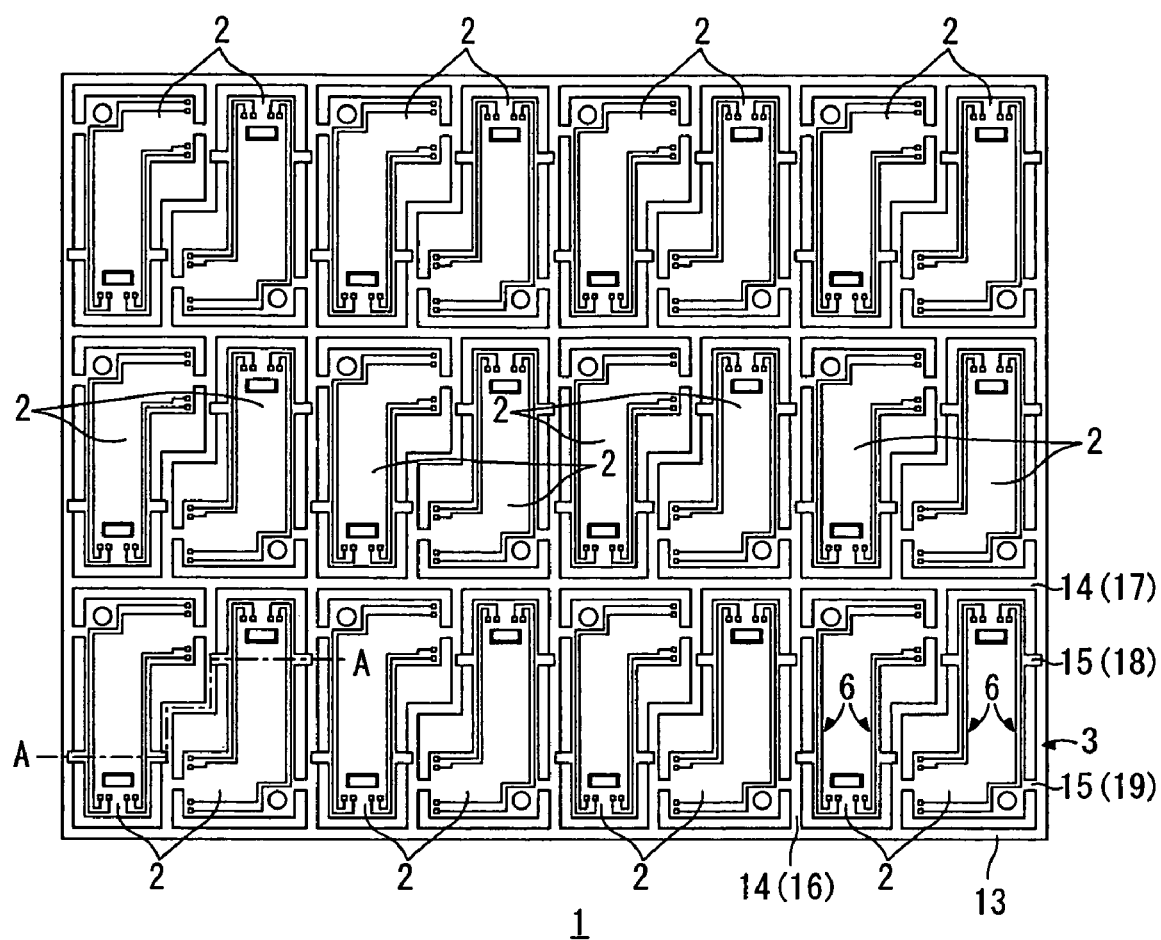
FIG. 1 is a plan view of a wired circuit board support sheet as an embodiment of a wired circuit board assembly according to the present invention.
Figure 2:
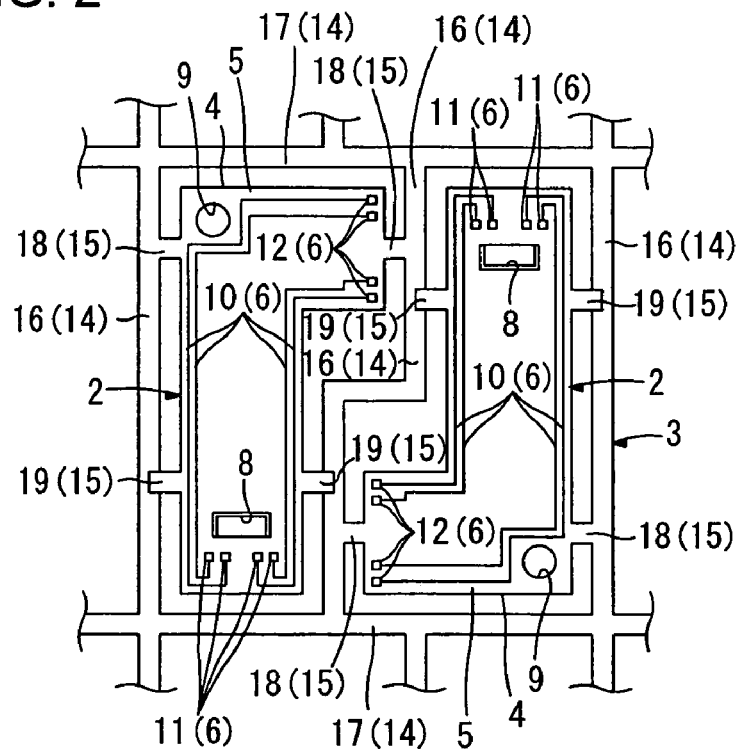
FIG. 2 is an enlarged plan view of a principal portion of the wired circuit board support sheet shown in FIG. 1.
Figure 3:
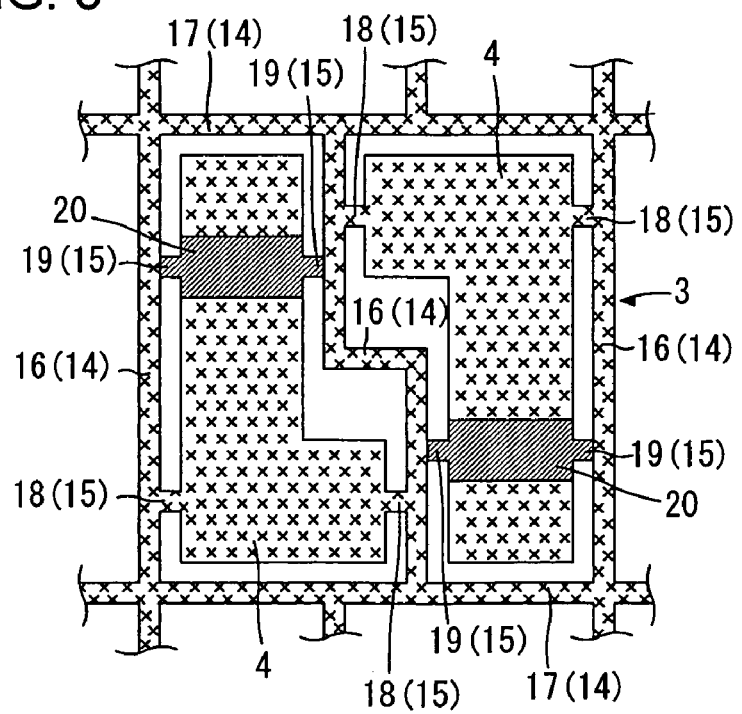
FIG. 3 is an enlarged rear view of the principal portion of the wired circuit board support sheet corresponding to FIG. 2.

FIG. 1 is a plan view of a wired circuit board support sheet as an embodiment of a wired circuit board assembly according to the present invention. FIG. 2 is an enlarged plan view of a principal portion of the wired circuit board support sheet shown in FIG. 1. FIG. 3 is an enlarged rear view of the principal portion of the wired circuit board support sheet corresponding to FIG. 2. In FIG. 2, cover insulating layers 7, which will be described later, are not depicted.

In FIG. 1, a wired circuit board support sheet 1 comprises a plurality of wired circuit boards 2 and a support frame 3 for supporting the plurality of wired circuit boards 2.

In the support frame 3, the plurality of wired circuit boards 2 are arranged and aligned vertically and laterally in mutually spaced apart relation. Each of the wired circuit boards 2 is a suspension board with circuit which supports a magnetic head (not shown) for a hard disk drive mounted thereon, while holding an extremely small space between the magnetic head and a magnetic disk, against an air flow caused by the magnetic head and the magnetic disk when they move relatively to each other. Each of the wired circuit boards 2 is integrally formed with a conductor pattern 6 for providing connection between the magnetic head and a read/write board.

Figure 5:
Figure 5:
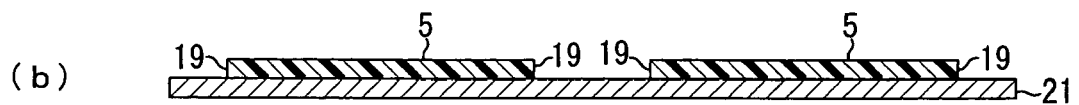
Figure 5:
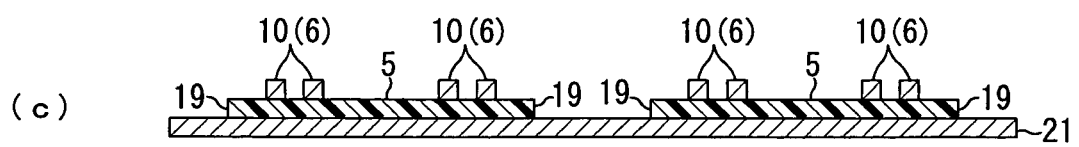
Figure 5:
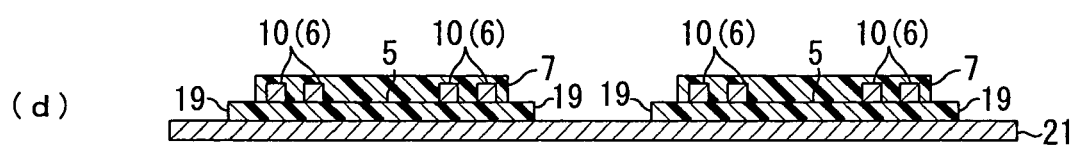
Figure 5:
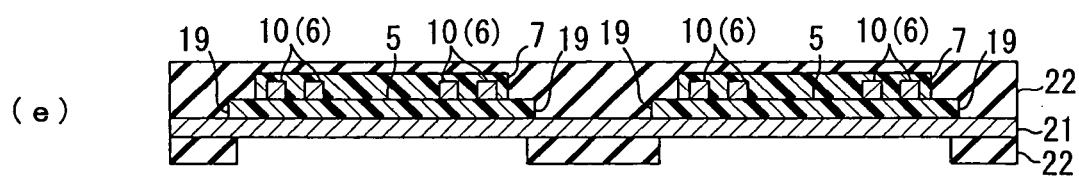
Figure 5:
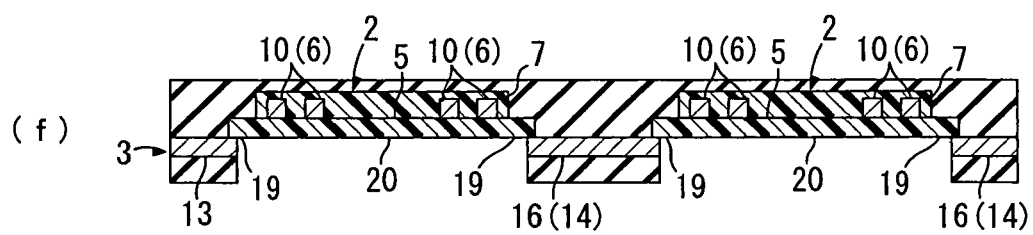
Figure 5:
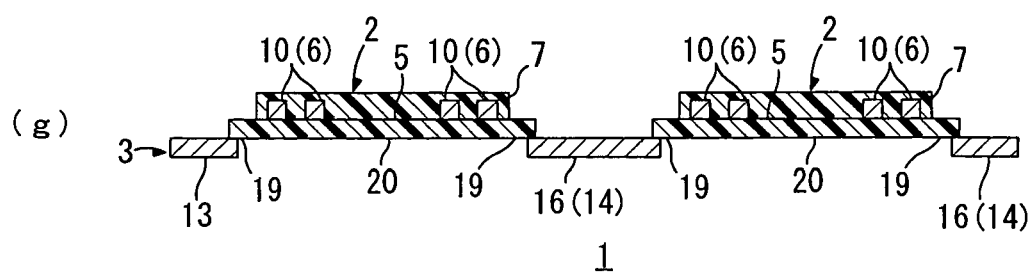

As shown in FIG. 5(g), each of the wired circuit boards 2 comprises: a support board 4 (see FIG. 3, since it is not shown in the cross-sectional view of FIG. 5 taken along the line A-A of FIG. 1); a base insulating layer 5 formed on the support board 4; the conductor pattern 6 formed on the base insulating layer 5; and a cover insulating layer 7 formed on the base insulating layer 5 to cover the conductor pattern 6.

As shown in FIGS. 2 and 3, the support board 4 is composed of a metal sheet 21 (see FIG. 5(a)) having a generally L-shaped configuration, as viewed from top. The support board 4 has a front end portion (one end portion in the lengthwise direction) thereof formed with a gimbal 8 opened to allow the mounting of the magnetic head on the wired circuit board 2 and has a rear end portion (the other end portion in the lengthwise direction) thereof formed with an attachment hole 9 opened to allow the attachment of the wired circuit board 2 to the hard disk drive.

The base insulating layer 5 is composed of a resin thin film and formed to define a specified pattern including the portion of the support board 4 to be formed with the conductor pattern 6, as shown in FIG. 5(g).

As shown in FIG. 2, the conductor pattern 6 integrally comprises: a plurality of wires 10; connection terminals 11 for magnetic head; and external connection terminals 12. The plurality of wires 10 extend in the lengthwise direction of the support board 4 and arranged and aligned in mutually spaced apart relation in the widthwise direction thereof.

The connection terminals 11 for magnetic head are disposed on the front end portion of the support board 4 to correspond to the individual wires 10. The connection terminals 11 for magnetic head are formed continuously from and integrally with the respective front end portions of the individual wires 10 and arranged in mutually spaced apart relation in the widthwise direction of the support board 4. To the connection terminals 11 for magnetic head, a magnetic head (not shown) is connected.

The external connection terminals 12 are disposed on the rear end portion of the support board 4 to correspond to the individual wires 10. The external connection terminals 12 are formed continuously from and integrally with the respective rear end portions of the individual wires 10 and arranged in mutually spaced apart relation in the widthwise direction of the support board 4. To the external connection terminals 12, the connection terminals (not shown) of the read/write board are connected. Each of the wires 10 has a width in the range of, e.g., 5 to 500 µm and preferably 10 to 200 µm. The spacing between each pair of the adjacent wires 10 is in the range of, e.g., 5 to 500 µm and preferably 10 to 200 µm.

The cover insulating layer 7 is composed of a resin thin film and formed on the base insulating layer 5 to define a specified pattern which covers the wires 10 and exposes each of the connection terminals 11 for magnetic head and the external connection terminals 12, as shown in FIG. 5(g).

Each (Any) of the wired circuit boards 2 is formed with a flexing portion 20 for flexing the wired circuit board 2. As shown in FIG. 3, the flexing portion 20 of each of the wired circuit boards 2 is formed by partially removing the support board 4 at a halfway point in the lengthwise direction of the wired circuit board 2. More specifically, the support board 4 has a part thereof removed at a halfway point in the lengthwise direction of the wired circuit board 2 in the form of a generally belt-like configuration when viewed from the rear side and the part extends along the entire width of the wired circuit board 2 orthogonal to the length thereof As a result, the flexing portion 20 is composed of the base insulating layer 5, the conductor pattern 6, and the cover insulating layer 7 and imparted with flexibility resulting from the removal of the support board 4. Accordingly, the wired circuit board 2 can be flexed (bent) at the flexing portion 20.

As shown in FIG. 1, the support frame 3 comprises: an outer frame 13; a middle frame 14; and connecting portions 15. The outer frame 13 is composed of the metal sheet 21 (see FIG. 5(a)) and formed as a frame body having a generally rectangular shape, as viewed from top, to surround the plurality of wired circuit boards 2 which are arranged and aligned therein.

The middle frame 14 is formed integrally with the outer frame 13 from the metal sheet 21 (see FIG. 5(*a*)). Inside the outer frame 13, the middle frame 14 is provided in spanning relation between the opposing parts of the outer frame 13 to be placed between each adjacent two of the wired circuit boards 2. The middle frame 14 includes vertical frame parts 16 each serving as a partition between any laterally adjacent two of the wired circuit boards 2 in FIG. 1 and lateral frame parts 17 each serving as a partition between any vertically adjacent two of the wired circuit boards 2 in FIG. 1. The vertical and lateral frame parts 16 and 17 are arranged orthogonally to each other to form a grid-like partition separating each adjacent two of the plurality of wired circuit boards 2. As shown in FIGS. 2 and 3, each of the wired circuit boards 2 is interposed between the corresponding adjacent two (either of which is the outer frame 13 when the wired circuit board 2 is at a lateral end position) of the vertical frame parts 16 which are located externally on both lateral sides of the wired circuit board 2 in spaced apart relation and between the corresponding adjacent two (either of which is the outer frame 13 when the wired circuit board 2 is at a vertical end position) of the lateral frame parts 17 which are located externally on both vertical sides of the wired circuit board 2 in spaced apart relation.

The connecting portions 15 are provided to connect each adjacent two of the vertical frame parts 16 (either of which is the outer frame 13 when the wired circuit board 2 interposed therebetween is at a lateral end position) to the wired circuit board 2 interposed therebetween. The connecting portions 15 include: first connecting portions 18; and second connecting portions 19.

The first connecting portions 18 are provided in laterally spanning relation between the both lateral ends of the rear end portions of the wired circuit boards 2 and the vertical frame parts 16 arranged in laterally opposing relation to the both lateral ends. The first connecting portions 18 are formed continuously from and integrally with each of the wired circuit boards 2 and the metal sheet 21 (see FIG. 5(*a*)) forming the middle frame 14.

Figure 4:
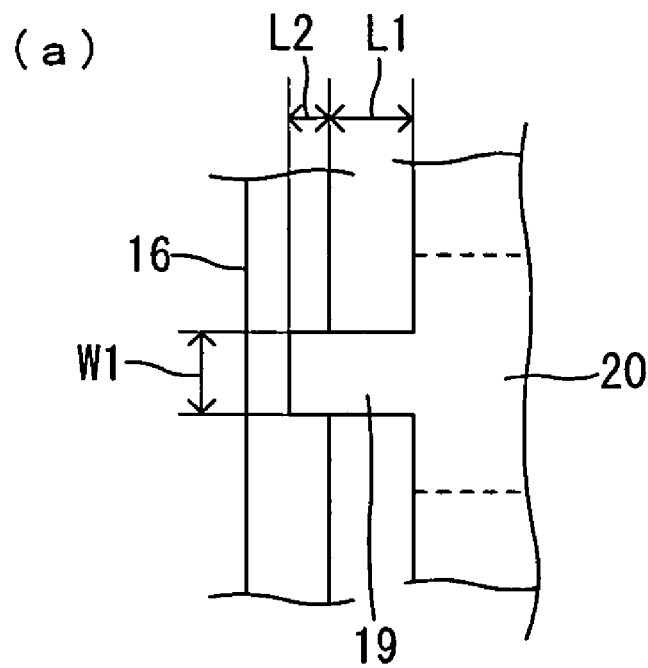
Figure 4:
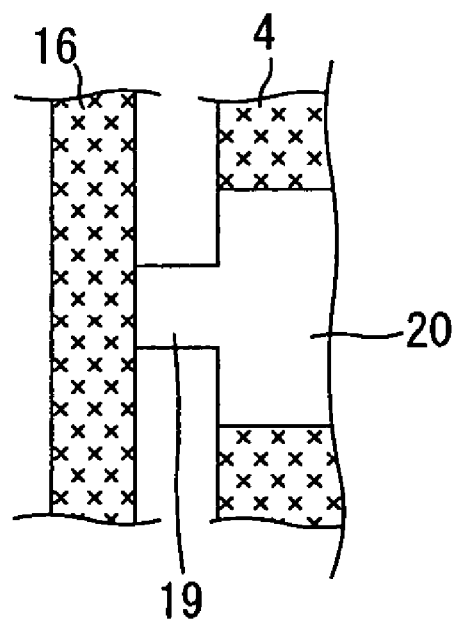

The second connecting portions 19 are provided in laterally spanning relation between the both lateral ends of the flexing portions 20 of the wired circuit boards 2 and the vertical frame parts 16 arranged in laterally opposing relation to the both lateral ends. The second connecting portions 19 are formed continuously from and integrally with the resin thin film forming the base insulating layer 5 of each of the wired circuit boards 2. More specifically, each of the second connecting portions 19 is formed to have a generally rectangular shape, as viewed from top, and extend continuously from the base insulating layer 5 to a halfway point in the lateral direction of the corresponding one of the vertical frame parts 16, as shown in FIGS. 4(*a*) and 4(*b*). The second connecting portion 19 has a free end portion thereof fixed to one surface of the vertical frame part 16.

In this manner, each of the wired circuit boards 2 is supported between the corresponding adjacent two of the vertical frame parts 16 which are arranged in spaced apart relation via the first and second connecting portions 18 and 19 which are arranged to be spaced apart in the lengthwise direction of the wired circuit board 2.

The spacing L1 between each of the vertical frame parts 16 and the flexing portion 20 located on either lateral side thereof is in the range of, e.g., 50 μm to 1 mm. The dimension W1 in the widthwise direction of each of the second connecting portions 19 (the direction orthogonal to the lengthwise direction (that is, the opposed direction between the vertical frame part 16 and the flexing portion 20) thereof) is in the range of, e.g., 50 μm to 1 mm. The length L2 of the free end portion fixed to one surface of the vertical frame part 16 is in the range of, e.g., 20 μm to 3 mm.

A description will be given next to a method for manufacturing the wired circuit board support sheet 1 with reference to FIG. 5.

First, as shown in FIG. 5(*a*), the method prepares the metal sheet 21. As can be seen from FIG. 1, the metal sheet 21 is a flat sheet having a generally rectangular shape, as viewed from top. For example, metal foil made of stainless steel, a 42-alloy, aluminum, a copper-beryllium alloy, phosphor bronze, or the like is used for the metal sheet 21. Preferably, stainless foil is used in terms of rigidity, anti-corrosion, and processibility. The thickness of the metal sheet 21 is in the range of, e.g., 10 to 100 μm, preferably 18 to 30 μm.

Then, as shown in FIG. 5(*b*), the method forms the plurality of base insulating layers 5 and the second connecting portions 19 extending continuously from each of the base insulating layers 5 on the metal sheet 21 to define a pattern corresponding to the plurality of wired circuit boards 2 in which each of the base insulating layers 5 and the second connecting portions 19 is integrated.

Examples of the resin thin film used to form each of the base insulating layers 5 and the second connecting portions 19 include resin thin films made of synthetic resins such as a polyimide resin, a polyamideimide resin, an acrylic resin, a polyethernitrile resin, a polyethersulfone resin, a polyethylene terephthalate resin, a polyethylene naphthalate resin, and a polyvinylchloride resin. Of these synthetic resin thin films, the resin thin film made of the polyimide resin is used preferably in terms of thermal resistance and chemical resistance. The resin thin film is preferably made of a photosensitive resin in terms of the ease of micro-fabrication of the pattern and, more preferably, made of a photosensitive polyimide resin (photosensitive polyamic acid resin).

To form the pattern in which each of the base insulating layers 5 and the second connecting portions 19 are integrated, a pattern provided for the plurality of wired circuit boards 1 is formed by, e.g., coating the entire surface of the metal sheet 21 with a varnish of a photosensitive resin (photosensitive polyamic acid resin), drying the varnish coat, exposing the dried coat to light via a photomask, and developing the exposed coat. The formed pattern is then cured by the application of heat so that the base insulating layers 5 each having a generally L-shaped configuration, as viewed from top, are formed on the metal sheet 21 in such a manner that they are vertically and laterally aligned in mutually spaced apart relation, as can be seen from FIG. 2. In, addition, the second connecting portions 19 are formed continuously from each of the base insulating layers 5.

The thickness of each of the base insulating layers 5 and the second connecting portions 19 is in the range of, e.g., 3 to 30 μm and preferably 5 to 15 μm.

Then, as shown in FIG. 5(*c*), the method forms the conductor patterns 6 on the individual base insulating layers 5.

For each of the conductor patterns 6, metal foil made of, e.g., copper, nickel, gold, a solder, an alloy thereof, or the like is used. Preferably, copper foil is used in terms of conductivity, low price, and processibility. A method for forming the conductor patterns 6 is not particularly limited. For example, a well-known patterning method such as an additive method or a subtractive method may be used appropriately to form the conductor patterns 6.

As can be seen from FIG. 2, the conductor patterns 6 are formed individually to correspond to the plurality of base insulating layers 5. As stated previously, each of the conductor patterns 6 is formed to define a pattern in which the plurality of wires 10, the connection terminals 11 for magnetic head, and the external connection terminals 12 are integrated. The thickness of each of the conductor patterns 6 is in the range of, e.g., 3 to 30 μm and preferably 8 to 18 μm.

Then, as shown in FIG. 5(d), the method forms the cover insulating layers 7 on the respective base insulating layers 5 such that the individual conductor patterns 6 are covered therewith.

Examples of the resin thin film used to form the cover insulating layers 7 include the same resin thin film as used to form the base insulating layers 5. Preferably, a photosensitive resin is used and, more preferably, a photosensitive polyimide resin (photosensitive polyamic acid resin) is used to form the cover insulating layers 7.

To form the cover insulating layers 7, a pattern for the individual base insulating layers 5 covering each of the wires 10 and having openings corresponding to the connection terminals 11 for magnetic heads and the external connection terminals 12 is formed by coating the entire surface of the metal sheet 21 including the base insulating layers 5 and the second connecting portions 19 with a varnish of, e.g., a photosensitive resin (photosensitive polyamic acid resin), exposing the varnish coat via a photomask, and then developing the exposed coat. The formed pattern is then cured by the application of heat so that the plurality of cover insulating layers 7 are formed to correspond to the individual base insulating layers 5. The thickness of each of the cover insulating layers 7 is in the range of, e.g., 5 to 20 μm and preferably 7 to 15 μm.

Then, as shown in FIGS. 5(e) to 5(g), the method partially removes the metal sheet 21, thereby providing the wired circuit board support sheet 1 comprising the plurality of wired circuit boards 2 and the support frame 3 for supporting the plurality of wired circuit boards 2.

More specifically, first as shown in FIG. 5(e), the respective portions of the metal sheet 21 corresponding to the support boards 4 (except for the portions thereof corresponding to the gimbals 8 and the attachment holes 9), the outer frame 13, the middle frame 14, and the first connecting portions 18 are covered with an etching resist 22. The etching resist 22 is formed by a well-known patterning method which performs exposure to light and development by using a liquid resist or a dry-film photoresist Then, as shown in FIG. 5(f), the metal sheet 21 exposed from the etching resist 22 is etched. By way of example, wet etching using an aqueous ferric chloride solution or the like as an etchant solution is performed as the etching. By the etching, the metal sheet 21 is processed into a configuration corresponding to the support boards 4 of the individual wired circuit boards 2, the outer frame 13, the middle frame 14, and the first connecting portions 18.

Then, as shown in FIG. 5(g), the etching resist 22 is removed by stripping or etching, whereby the wired circuit board support sheet 1 is obtained.

In the wired circuit board support sheet 1 thus obtained, each of the wired circuit boards 2 has the flexing portion 20 formed by removing the support board 4 to obtain the flexing property, as shown in FIG. 3. The flexing portion 20 is connected to the vertical frame parts 16 of the middle frame 14 of the support frame 3 which are arranged between the corresponding adjacent two of the wired circuit boards 2 via the second connecting portions 19. The arrangement allows effective prevention of the breakage of the flexing portion 20 of each of the wired circuit boards 2 supported by the support frame 3.

The individual wired circuit boards 2 in the wired circuit board support sheet 1 are separated from the support frame 3 by cutting the first and second connecting portions 18 and 19 using a cutting blade, to be prepared for use.

When each of the wired circuit boards 2 is used, the metal sheet 21 has been removed from any part of the second connecting portions 19 so that each of the second connecting portions 19 is composed only of the resin thin film extending continuously from the base insulating layer 5 of the flexing portion 20. Accordingly, even though any of the second connecting portions 19 that have been cut remains on the flexing portion 20, the remaining second connecting portion 19 also has flexibility and can be flexed, similarly to the flexing portion 20. This can prevent the flexing portion 20, when it is flexed, from being broken through contact with the remaining second connecting portion 19 or ruptured by the rigidity of the remaining second connecting portion 19, unlike in the case where each of the second connecting portions 19 is composed of the metal sheet 21.

This can also reduce damage to the cutting blade in cutting the second connecting portions 19 when the individual wired circuit boards 2 are separated from the support frame 3.

Accordingly, such a wired circuit board support sheet 1 is suitable for use as a wired circuit board support sheet 1 as described above, in which the base insulating layers 5, the conductor patterns 6, and the cover insulating layers 7 are formed successively on the support boards 4 and the plurality of wired circuit boards 2 used as suspension boards with circuits are supported by the support frame 3.

Figure 6:
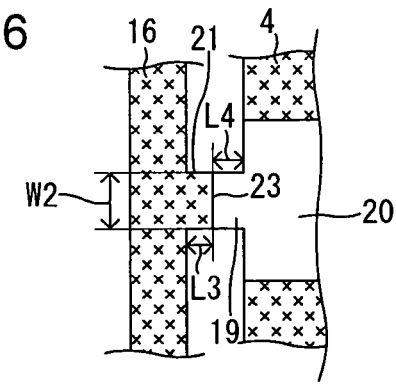
FIG. 6 is an enlarged rear view of a principal portion of the second connecting portion in an embodiment (in which the metal sheet is formed to remain in a generally rectangular configuration having the same width as a resin thin film when viewed from the rear side) different from the second connecting portion shown in FIG. 3.
Figure 7:
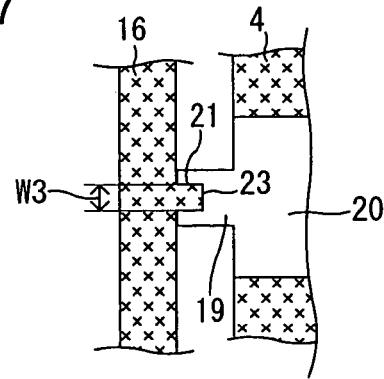
FIG. 7 is an enlarged rear view of the principal portion of the second connecting portion in an embodiment (in which the metal sheet is formed to remain as a protruding portion having a width smaller than that of the resin thin film) different from the second connecting portion shown in FIG. 3.
Figure 8:
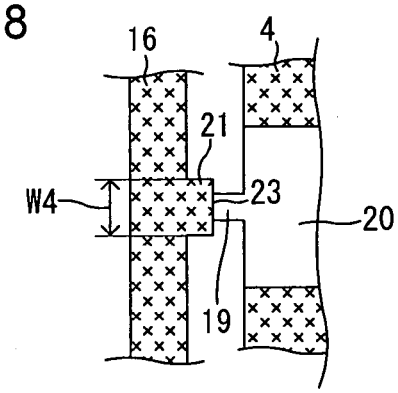
FIG. 8 is an enlarged rear view of a principal portion of the second connecting portion in an embodiment (in which the metal sheet is formed to remain as a protruding portion having a width larger than that of the resin thin film) different from the second connecting portion shown in FIG. 3.

Although each of the second connecting portions 19 has had any part thereof composed only of the resin thin film extending continuously from the base insulating layer 5 of the flexing portion 20 in the foregoing description, it is also possible to form a part of the second connecting portion 19 from the metal sheet 21 extending continuously from the vertical frame part 19, as shown in FIGS. 6 to 8. Although FIGS. 6 to 8 show only the back surface of the second connecting portion 19, the top surface thereof is the same as shown in FIG. 4(a). The second connecting portions 19 shown in FIGS. 6 to 8 can be formed by the same method as illustrated in FIG. 5 described above.

In FIG. 6, the metal sheet 21 is formed to extend from the vertical frame part 16 toward the flexing portion 20 and remain halfway in the lengthwise direction of the second connecting portion 19. The remaining portion of the metal sheet 21 has a generally rectangular configuration and the same width as the resin thin film when viewed from the rear side. The second connecting portion 19 shown in FIG. 6 has a boundary 23 formed between the part thereof partly overlapping the vertical frame part 16 and the part thereof extending continuously from the flexing portion 20. The part of the second connecting portion 19 partly overlapping the vertical frame part 16 is composed of the resin thin film and the metal sheet 21 remaining halfway in the lengthwise direction of the second connecting portion 19 and extending along the width (orthogonal to the length) thereof. On the other hand, the part of the second connecting portion 19 extending continuously from the flexing portion 20 is composed only of the resin thin film since the metal sheet 21 has been removed therefrom. Accordingly, when the individual circuit boards 2 are separated from the support frame 3, if the cutting blade is operated to cut into the resin thin film along the boundary 23, it is guided by the free end portion of the metal sheet 21. This allows easy and uniform separation of the individual wired circuit boards 2 from the support frame 3.

In the second connecting portion 19 shown in FIG. 6, the dimension L3 in the lengthwise direction of the metal sheet 21 is, e.g., 1 mm or less. The dimension L4 in the lengthwise direction of the resin thin film is in the range of, e.g., 20 μm to 1 mm. The dimension W2 in the widthwise direction of each of the metal sheet 21 and the resin thin film is in the range of, e.g., 50 μm to 1.2 mm.

In FIG. 7, the metal sheet 21 is formed to extend from the vertical frame part 16 toward the flexing portion 20 and remain as a protruding portion having a width smaller than that of the resin thin film. In the part of the second connecting portion 19 partly overlapping the vertical frame part 16 shown in FIG. 7, the resin thin film is exposed on both widthwise sides of the metal sheet 21 remaining as the protruding portion. As a result, the second connecting portion 19 shown in FIG. 7 is more flexible than the second connecting portion 19 shown in FIG. 6 and allows more effective prevention of the breakage of the flexing portion 20 of each of the wired circuit boards 2 supported by the support frame 3. In addition, the second connecting portion 19 allows easy and uniform separation of the individual wired circuit boards 2 from the support frame 3 by allowing the metal sheet 21 to guide the cutting blade along the boundary 23 between the metal sheet 21 and the resin thin film.

At the second connecting portion 19 shown in FIG. 7, the dimension W3 in the widthwise direction of the metal sheet 21 remaining as the protruding portion is, e.g., 1.2 mm or less.

In FIG. 8, the metal sheet 21 is formed to extend from the vertical frame part 16 toward the flexing portion 20 and remain as a protruding portion having a width larger than that of the resin thin film. In the second connecting portion 19 shown in FIG. 8, the metal sheet 21 remaining as the protruding portion is wider than the boundary 23 between itself and the resin thin film. Accordingly, when the individual wired circuit boards 2 are separated from the support frame 3, if the cutting blade is operated to cut into the resin thin film along the free end portion of the metal sheet 21 remaining as the protruding portion, the second connecting portion 19 shown in FIG. 8 allows smoother guiding of the cutting blade along the boundary 23 than the second connecting portion 19 shown in FIG. 6. This allows easier and more uniform separation of the individual circuit boards 2 from the support frame 3.

In the second connecting portion 19 shown in FIG. 8, the dimension W4 in the widthwise direction of the metal sheet 21 remaining as the protruding portion is in the range of, e.g., 50 μm to 1.2 mm.

Figure 9:
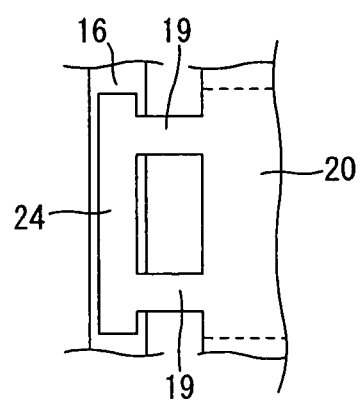
FIG. 9 is an enlarged plan view of a principal portion of the second connecting portion in an embodiment (including two second connecting portions with a spanning portion formed therebetween) different from the second connecting portions shown in FIG. 2.

As shown in FIG. 9, it is also possible to form the two second connecting portions 19 which are spaced apart in the lengthwise direction of the wired circuit board 2 and provide a bridge portion 24 formed in integrally spanning relation between the free end portions of the resin thin film of each of the second connecting portions 19 to overlie the vertical frame part 16, to thereby enhance the rigidity of the part of each of the second connecting portions 19 partly overlapping the vertical frame part 16. The enhanced rigidity allows more reliable prevention of the breakage of the fixing portion 20 of each of the wired circuit boards 2 supported by the support frame 3. Although FIG. 9 shows only the top surface of each of the second connecting portions 19, the back surface thereof is the same as shown in FIG. 4(b). The second connecting portion 19 shown in FIG. 9 can be formed by the same method as illustrated in FIG. 5 described above.

Although each of the second connecting portions 19 has had at least one part thereof composed only of the resin coating of the base insulating layer 5 in the foregoing description, the second connecting portion 19 may also be formed to have at least one part thereof composed only of the resin coating of the cover insulating layer 7 depending on the purpose and application thereof. Alternatively, the second connecting portion 19 may also be formed to have at least one part thereof composed of each of the respective resin coatings of the base insulating layer 5 and the cover insulating layer 7, of each of the metal sheet 21 and the resin coating, or only of the metal sheet 21.

Since the support frame 3 is formed appropriately in accordance with the configuration of each of the wired circuit boards 2, it is not in the least limited to the support frame 3 composed of the vertical frame parts 16 and the lateral frame parts 17 described above. The first connecting portions 18 and/or the second connecting portions 19 may also be connected to the outer frame 13. Alternatively, the outer frame 13 or the middle frame 14 need not be provided.

While the illustrative embodiments of the present invention are provided in the above description, such is for illustrative purpose only and it is not to be construed restrictively. Modification and variation of the present invention that will be obvious to those skilled in the art is to be covered by the following claims.

What is claimed is:

1. A wired circuit board assembly comprising:
a support frame; and
a plurality of wired circuit boards that are spaced apart from the support frame along a perimeter of the wired circuit boards and are mechanically coupled to the support frame at predefined positions along the perimeter of the wired circuit boards, the plurality of wired circuit boards comprising:
 a support board composed of a metal sheet;
 a base insulating layer composed of a resin thin film formed on the support board;
 a conductor pattern formed on the base insulating layer;
 a cover insulating layer composed of a resin thin film formed on the base insulating layer to cover the conductor pattern;
 connecting portions that are arranged at the predefined positions along the perimeter of the wired circuit boards to mechanically couple the wired circuit boards and the support frame; and
 a flexing portion that is defined by removal of a portion of the support board of the wired circuit board, the flexing portion being connected to the connecting portions.

2. A wired circuit board assembly according to claim 1, wherein the connecting portions consist of at least one of the base insulating layer and the cover insulating layer.

3. A wired circuit board assembly according to claim 1, wherein the wired circuit board is a suspension board with circuit.

4. A wired circuit board assembly according to claim 1, wherein the connecting portions are formed continuously from and integral with the wired circuit boards.

5. A wired circuit board assembly according to claim 1, wherein a portion of the connecting portions comprise the support board.

6. A wired circuit board assembly according to claim 1, wherein the flexing portion includes a larger width than the connecting portions.

7. A wired circuit board assembly according to claim 1, wherein the connecting portions include different widths between the wired circuit boards and the support frame.

8. A wired circuit board assembly according to claim 1, wherein the connecting portions include a hole defined between the wired circuit boards and the support frame.

* * * * *